United States Patent
Yagisawa

[11] Patent Number: 6,136,138
[45] Date of Patent: Oct. 24, 2000

[54] METHOD AND APPARATUS FOR CHEMICAL MECHANICAL POLISHING OF A SEMICONDUCTOR WAFER

[75] Inventor: Kouki Yagisawa, Tateyama, Japan

[73] Assignee: Nippon Steel Semiconductor Corporation, Tateyama, Japan

[21] Appl. No.: 09/149,037

[22] Filed: Sep. 8, 1998

[51] Int. Cl.⁷ .............................. B24B 5/00; B24B 29/00; C03C 15/00; H01L 21/302; H01L 21/463
[52] U.S. Cl. ............................. 156/345; 216/88; 216/92; 438/692; 438/693; 451/287
[58] Field of Search ...................... 156/345 LP; 451/119, 451/283, 285, 287; 216/52, 88–92; 438/690–693

[56] References Cited

U.S. PATENT DOCUMENTS

| | | | |
|---|---|---|---|
| 5,347,763 | 9/1994 | Miyamato et al. | 451/241 |
| 5,514,245 | 5/1996 | Doan et al. | 156/636 J |
| 5,679,212 | 10/1997 | Kato et al. | 156/636.1 |
| 5,944,582 | 8/1999 | Talieh | 451/41 |

FOREIGN PATENT DOCUMENTS 5-277908  10/1993  Japan .

*Primary Examiner*—Jeffrie R Lund
*Assistant Examiner*—Alva C. Powell
*Attorney, Agent, or Firm*—Oblon, Spivak, McClelland, Maier & Neustadt, P.C.

[57] ABSTRACT

The invention involves technology related to chemical mechanical polishing using a chemical mechanical polishing apparatus having a wafer carrier for holding a semiconductor wafer, a polishing platen which is able to be rotated and which is positioned facing the surface of the wafer carrier on which the wafer is held, and a circular polishing cloth mounted on the polishing platen for polishing the semiconductor wafer, the polishing cloth having a smaller diameter than the diameter of the semiconductor wafer, and the polishing platen being movable horizontally across the surface of the semiconductor wafer. While rotating the semiconductor wafer held on the wafer carrier, the polishing platen is moved horizontally across the surface of the semiconductor wafer so that the displacement velocity of the polishing platen is slower at a central portion of the semiconductor wafer than at an outer portion, and the surface of the semiconductor wafer is polished with the polishing cloth. As a result, polishing uniformity is improved.

7 Claims, 3 Drawing Sheets

METHOD AND APPARATUS FOR CHEMICAL MECHANICAL POLISHING OF A SEMICONDUCTOR WAFER

BACKGROUND OF THE INVENTION

1. Field of the Invention

The present invention relates to a suitable chemical mechanical polishing apparatus and a chemical mechanical polishing method for polishing and planarizing the surface of a semiconductor wafer during the manufacturing process of a semiconductor device.

2. Description of the Related Art

Recent developments have produced high density integration of semiconductor devices and an accompanying pattern miniaturization, and in order to ensure the simple and reliable formation of particularly multi-layered miniature patterns, the planarization of the surface of a silicon wafer during the manufacturing process has become very important. Heretofore, a planarization method has been employed where a thick film of a material which is itself easily planarized is deposited on to the surface of the wafer to allow smoothing of any unevenness in the wafer surface. At this point chemical mechanical polishing methods are widely used as they allow the film on the wafer surface to then be polished to achieve even better planarization, and the film can also fill in any depressions which exist in the wafer surface.

Chemical mechanical polishing is a technique for planarizing the surface of a wafer whereby an alkali solution and a polishing slurry incorporating small abrasive particles are used to chemically and mechanically polish the wafer surface. An example of a conventional chemical mechanical polishing apparatus is shown in Japanese Patent Application, First Publication No. Hei-5-277908. FIG. 4 is a schematic diagram of the apparatus reported therein. As is shown in FIG. 4, a wafer carrier 1 which holds a semiconductor wafer W, and a polishing platen 3 on which is mounted a polishing pad 2 are positioned facing one another. Then, while the polishing pad 2, which is larger than the size of the wafer W, is rotated, the wafer W is pushed against the polishing pad 2 and rotated, and a polishing slurry which is supplied via a pipe 4 is then used to polish and thus planarize the surface of the wafer W.

However, because conventional chemical mechanical polishing apparatus employ large diameter polishing pads 2, the uniformity in the quality of the polishing pad can adversely effect the uniformity of the polishing. Furthermore, the apparatus is constructed so that the wafer W is polished by rotation against the large diameter polishing pad 2, and so a velocity differential develops between the central portion of the wafer and the outer portion of the wafer, due to a difference in the radius of gyration. Consequently, the outer portion of the wafer is polished to a greater degree than the inner portion, resulting in radial polishing irregularities on the wafer W.

SUMMARY OF THE INVENTION

It is an object of the present invention to solve the above problems by providing a chemical mechanical polishing apparatus and a chemical mechanical polishing method which enable uniform planarization of the surface of a semiconductor wafer.

To achieve the above object, a chemical mechanical polishing apparatus of the present invention comprises; a wafer carrier for holding a semiconductor wafer, a polishing platen which is positioned facing a surface of the wafer carrier on which the wafer is held, a polishing platen rotation device for rotating the polishing platen, a polishing platen horizontal displacement device for moving the polishing platen horizontally across the surface of the semiconductor wafer, a circular polishing cloth mounted on the polishing platen, and having a smaller diameter than the diameter of the semiconductor wafer, for polishing the semiconductor wafer, and a polishing slurry supply device for supplying a polishing slurry onto the semiconductor wafer.

With the chemical mechanical polishing apparatus of the present invention, because the surface area of the polishing cloth is much smaller than with conventional apparatus, irregularities in the polished surface resulting from distortions, or a lack of uniformity in the polishing pad itself can be reduced. Moreover, in those cases where the polishing cloth is rotated, because the polishing cloth itself is small there is little velocity differential between the central portion and the outer portion of the cloth, and any difference in etching rate resulting from such a velocity differential is minimal, thus enabling the suppression of polishing irregularities. Furthermore, because the load on the drive motor (the polishing platen rotation device) used to rotate the polishing platen can be reduced, the wafer side will also be stable under rotation, enabling the wafer to be polished with even greater uniformity.

Moreover, the apparatus may also have a polishing platen displacement velocity control device for controlling a horizontal displacement velocity of the polishing platen so that the horizontal displacement velocity is slower at a central portion of the semiconductor wafer than at an outer portion. Furthermore, a wafer carrier rotation device may also be provided for rotating the wafer carrier to thereby rotate the semiconductor wafer. It is also preferable if the polishing slurry supply device is positioned outside of the horizontal displacement path of the polishing platen.

By equipping the apparatus with a control device for controlling the horizontal displacement velocity of the polishing platen, the displacement velocity of the polishing cloth can be controlled so that it is highest at the outer portion of the semiconductor wafer and then decreases the closer the cloth moves to the center of the wafer, thus enabling the contact time between the polishing cloth and the wafer to be maintained at a constant value for both the central and outer portions of the wafer. Consequently, compensation can be made for any difference in the etching rate resulting from a velocity differential between the central and outer portions of the wafer, enabling an even greater improvement in the polishing uniformity.

A chemical mechanical polishing method of the present invention comprises; a step for setting a semiconductor wafer on a wafer carrier of a chemical mechanical polishing apparatus which incorporates a wafer carrier, a polishing platen which is able to be rotated and which is positioned facing the surface of the wafer carrier on which the wafer is held, and a circular polishing cloth mounted on the polishing platen and having a smaller diameter than the diameter of the semiconductor wafer, a step for supplying a polishing slurry onto the semiconductor wafer, a step for rotating the wafer carrier while the semiconductor wafer is held on the wafer carrier, and a step for polishing the surface of the semiconductor wafer with the polishing cloth by moving the polishing platen horizontally across the surface of the semiconductor wafer while rotating the polishing platen.

Furthermore, the polishing platen may also be moved horizontally across the surface of the semiconductor wafer so that the displacement velocity of the polishing platen is slower at the central portion of the semiconductor wafer than at the outer portion. Moreover, the etching rate during polishing may be controlled by adjusting the displacement velocity of the polishing platen, or the rotation rate of the polishing platen, or the rotation rate of the semiconductor wafer.

Because the present invention allows the surface of a semiconductor wafer to be uniformly planarized, the planarization process can be greatly improved. In addition, the invention also offers advantageous effects through the entire manufacturing process in that the line width in the subsequent photolithography process can be more readily controlled, and due to a decrease in the number of defects in the metallic wiring, the yield of semiconductor devices can be improved.

DETAILED DESCRIPTION OF THE PREFERRED EMBODIMENT

Below is a description of an embodiment of the present invention.

Figure 1:
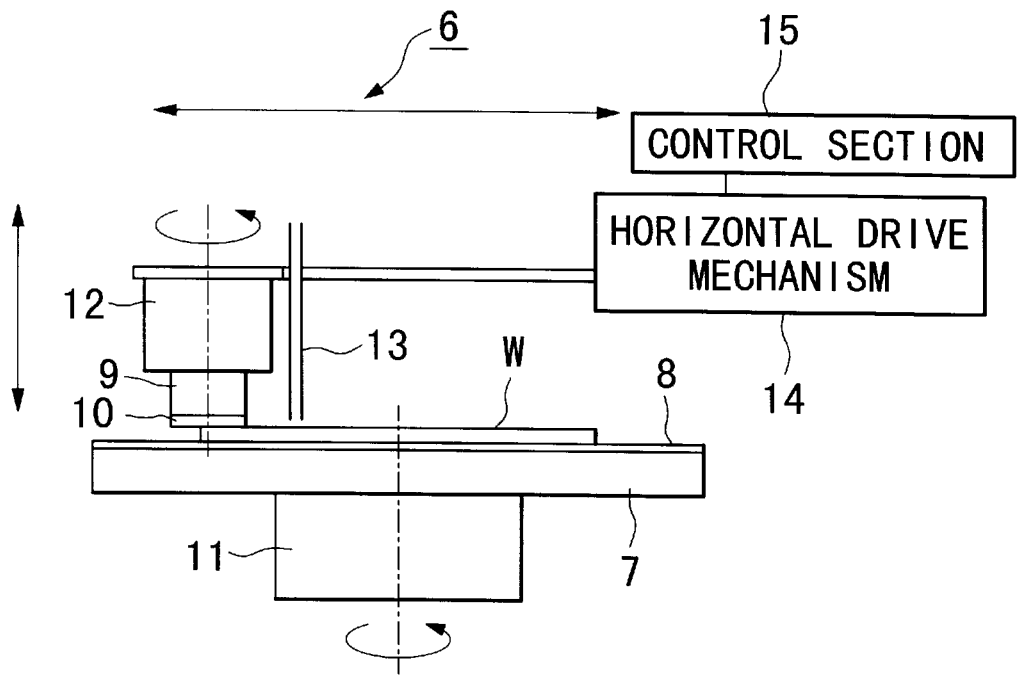
FIG. 1 is a front view showing a schematic representation of a chemical mechanical polishing apparatus according to an embodiment of the present invention.
Figure 2:
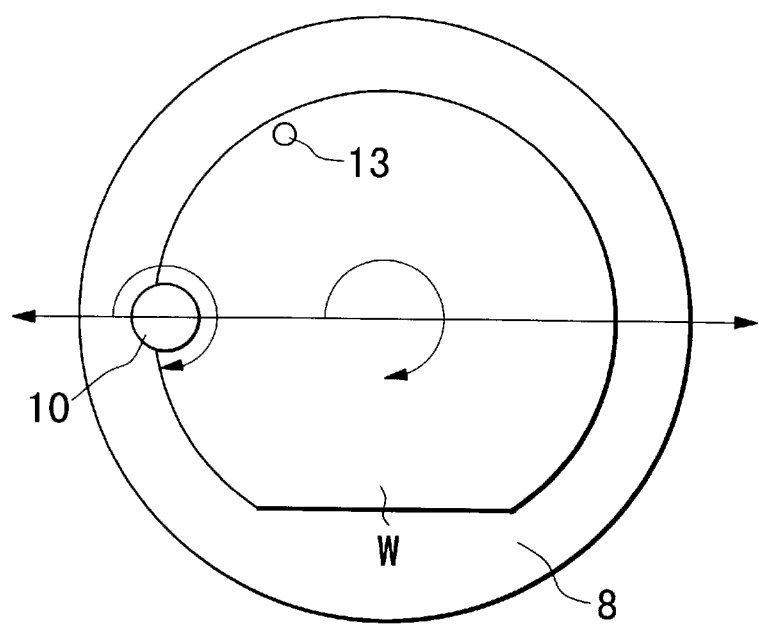
FIG. 2 is a plan view showing a schematic representation of a chemical mechanical polishing apparatus according to an embodiment of the present invention.

FIG. 1 and FIG. 2 are diagrams showing schematic representations of a chemical mechanical polishing apparatus 6 according to the embodiment, where numeral 7 denotes a wafer carrier, numeral 8 a carrier pad, numeral 9 a polishing platen, numeral 10 a polishing cloth, numerals 11 and 12 drive motors, and numeral 13 a slurry supply pipe.

The chemical mechanical polishing apparatus 6 according to the embodiment is equipped with the wafer carrier 7 for holding a semiconductor wafer W. The wafer carrier 7 has an aperture (not shown in the drawings) in the surface on which the wafer is held, and once placed on the wafer carrier 7 the wafer W is suctioned and held against the carrier 7 by applying a vacuum suction via the aperture. The carrier pad 8 made of a soft material is mounted on the upper surface of the wafer carrier 7 which comes in direct contact with the underside of the wafer W. The wafer carrier 7 is connected to the drive motor 11 and by rotating the wafer carrier 7 via the drive motor 11, the wafer W held on top of the wafer carrier 7 is rotated continuously.

The polishing platen 9 is positioned facing the surface of the wafer carrier 7 on which the wafer is held. On the lower surface of the polishing platen 9 is mounted the circular polishing cloth 10 of a diameter smaller than that of the wafer W to be polished, eg. a polishing cloth of diameter 5 cm for a wafer of diameter 6 inches (approximately 15 cm). The polishing platen 9 is constructed of a hard, incompressible material such as a metal. The polishing platen is connected to a vertical drive mechanism (not shown in the drawings) and the drive motor 12, with the polishing platen 9 being rotated via the drive motor 12. Furthermore, the polishing platen 9 is moved horizontally across the surface of the wafer along a diameter of the wafer W by a horizontal drive mechanism 14 comprising, for example, a ball screw and a motor. The horizontal drive mechanism 14 is connected to a control section 15 which controls the horizontal displacement velocity of the polishing platen 9. The apparatus is also equipped with the slurry supply pipe 13 for supplying a polishing slurry incorporating an abrasive such as alumina or silica to the area between the wafer W held on top of the wafer carrier 7 and the polishing cloth 10. The slurry supply pipe 13 is positioned outside of the horizontal displacement path of the polishing platen 9, and consequently does not impede the horizontal displacement of the polishing platen 9.

Next is a description of a sample chemical mechanical polishing method utilizing the apparatus described above, with reference to FIG. 3A through FIG. 3D.

Figure 3A:
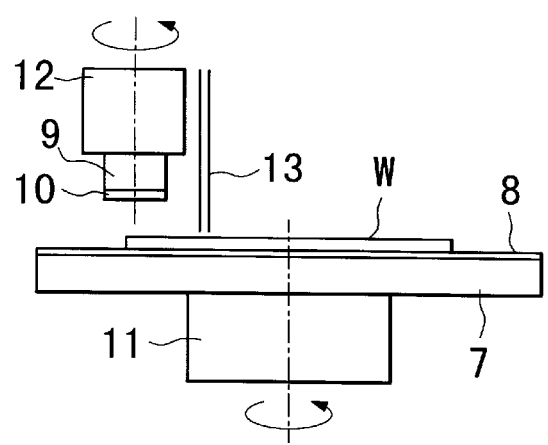
FIG. 3A through FIG. 3D are diagrams showing the order of a chemical mechanical polishing method utilizing a chemical mechanical polishing apparatus according to the present invention.

In this example the wafer to be polished is constructed by forming a gate oxide film of SiO2 and a gate electrode of polysilicon on top of a 6 inch substrate of silicon, and then consecutively forming a capacitor lower electrode of polysilicon, a capacitor insulation film of Si3N4, and a capacitor upper electrode of polysilicon, and finally depositing an insulation film of BPSG (boron-phospho-silicate-glass) on the top. First, as is shown in FIG. 3A, the wafer W is held against the wafer carrier 7 and then rotated via the drive motor 11 at 15 rpm for example, and the polishing platen 9 is similarly rotated via the drive motor 12 at 15 rpm for example.

Figure 3B:
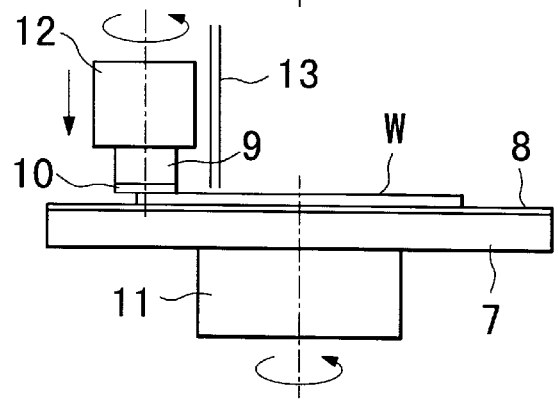
Figure 3C:
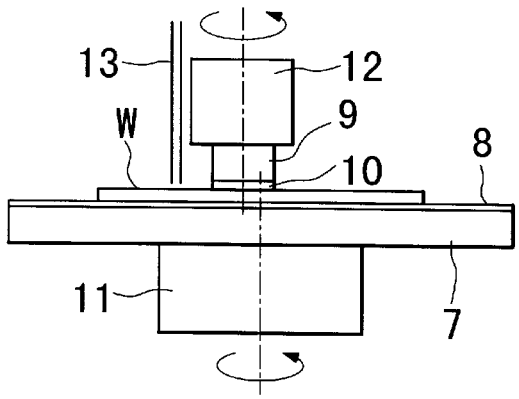
Figure 3D:
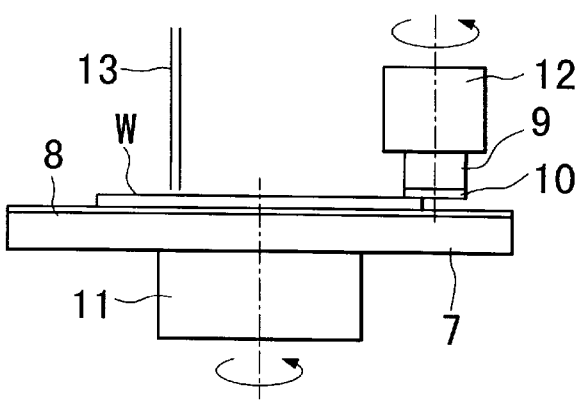
Figure 4:
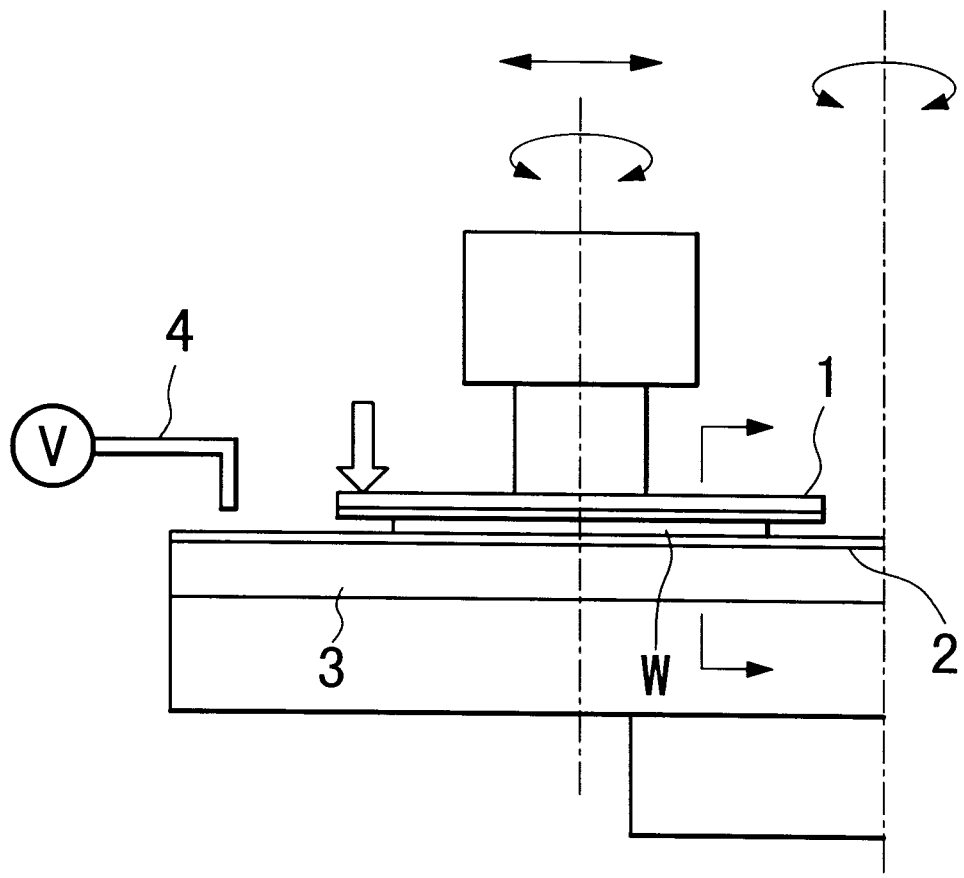
FIG. 4 is a front view showing a schematic representation of a conventional chemical mechanical polishing apparatus.

Next, as is shown in FIG. 3B, a polishing slurry is supplied via the supply pipe 13, and the polishing platen 9 then lowered down until it is pushing down on the outer portion of the wafer W. Then, as is shown in FIG. 3C, the polishing platen 9 is moved horizontally across the surface of the wafer W along a diameter of the wafer W. The displacement velocity of the polishing platen 9 is controlled by the control section 15 so that it is highest at the outer portion of the wafer and then decreases the closer the platen moves to the center of the wafer. Thus, the velocity of the polishing platen 9 is gradually altered as it moves across the diameter of the wafer W so that, for example, it is travelling at 1 cm/sec at the outer portion of the wafer and 0.5 cm/sec at the central portion of the wafer. Using this type of technique the polishing platen 9 is moved from the left edge of the wafer to the right edge, as shown in FIG. 3D. Furthermore, the same technique is then used to move the platen from the right edge to the left.

If the movement of the polishing platen 9 from the left edge of the wafer to the right edge of the wafer as shown in FIG. 3B through FIG. 3D is termed one cycle, and the average displacement velocity across the surface of the wafer is deemed to be 0.75 cm/sec, as in the above example, then for a 6 inch wafer, the completion of one cycle will require approximately 20 seconds. Consequently, by prior determination of the etching rate for one cycle, it is possible to complete the number of cycles required to obtain the desired film thickness, so that for example six polishing cycles will generate a wafer of the desired film thickness across the entire wafer surface. It is possible to control the etching rate by adjusting the displacement velocity of the polishing platen 9 and thus altering the time required for the completion of one cycle, or by adjusting the rotation rate of the polishing platen 9 or the rotation rate of the wafer W. Finally, the polishing platen 9 is lifted up and away from the wafer W, thus completing the polishing.

With the chemical mechanical polishing apparatus 6 according to the embodiment described above, because the surface area of the polishing cloth 10 is much smaller than with conventional apparatus, irregularities in the polished surface resulting from distortions, or a lack of uniformity in the polishing pad itself can be reduced. Moreover, because the polishing cloth is small there is little velocity differential between the central portion and the outer portion of the polishing cloth 10, and any difference in etching rate resulting from such a velocity differential is minimal, thus enabling the suppression of polishing irregularities. Furthermore, because the load on the drive motor 12 used to drive the polishing platen 9 can be reduced, the wafer side will also be stable under rotation, enabling the wafer W to be polished with even greater uniformity.

Furthermore, by equipping the apparatus 6 described above with a control section 15 for controlling the horizontal displacement velocity of the polishing platen 9, the displacement velocity of the polishing cloth 10 can be controlled so that it is highest at the outer portion of the semiconductor wafer and then decreases the closer the cloth moves to the center of the wafer, thus enabling the contact time between the polishing cloth 10 and the wafer W to be maintained at a constant value for both the central and outer portions of the wafer. Consequently, compensation can be made for any difference in the etching rate resulting from a velocity differential between the central and outer portions of the wafer, enabling an even greater improvement in the polishing uniformity.

The technical extent of the present invention is not limited to the embodiment described above, and includes various modifications that do not deviate from the gist of the invention. For example, the dimensions of the polishing cloth and the actual structure of the control section can be modified as required.

What is claimed is:

1. A chemical mechanical polishing apparatus comprising:
    a wafer carrier configured to hold a semiconductor wafer;
    a polishing platen positioned facing a surface of said wafer carrier on which the wafer is held;
    polishing platen rotation device configured to rotate said polishing platen;
    polishing platen horizontal displacement device configured to move said polishing platen horizontally and linearly across a surface of said semiconductor wafer;
    a circular polishing cloth mounted on said polishing platen and having a diameter that is smaller than a diameter of said semiconductor wafer, for polishing said semiconductor wafer; and
    a polishing slurry supply device configured to supply a polishing slurry onto said semiconductor wafer and positioned outside of a horizontal displacement path of said polishing platen.

2. A chemical mechanical polishing apparatus according to claim 1, having wafer carrier device configured to rotate for rotating said wafer carrier to thereby rotate said semiconductor wafer.

3. A chemical mechanical polishing apparatus comprising:
    a wafer carrier configured to hold a semiconductor wafer;
    a polishing platen positioned facing a surface of said wafer carrier on which the wafer is held;
    polishing platen rotation device configured to rotate said polishing platen;
    polishing platen horizontal displacement device configured to move said polishing platen horizontally across a surface of said semiconductor wafer;
    a circular polishing cloth mounted on said polishing platen and having a diameter that is smaller than a diameter of said semiconductor wafer, for polishing said semiconductor wafer;
    polishing platen displacement velocity control device configured to control a horizontal displacement velocity of said polishing platen so that the horizontal displacement velocity is slower at a central portion of the semiconductor wafer than at an outer portion; and
    a polishing slurry supply device configured to supply a polishing slurry onto said semiconductor wafer and positioned outside of a horizontal displacement path of said polishing platen.

4. A chemical mechanical polishing apparatus according to claim 3, having wafer carrier device configured to rotate for rotating said wafer carrier to thereby rotate said semiconductor wafer.

5. A chemical mechanical polishing method comprising the steps of:
    setting a semiconductor wafer on a wafer carrier of a chemical mechanical polishing apparatus which incorporates a wafer carrier, a polishing platen which is able to be rotated and which is positioned facing a surface of said wafer carrier on which the wafer is held, and a circular polishing cloth mounted on said polishing platen and having a diameter smaller than a diameter of said semiconductor wafer;
    supplying a polishing slurry onto said semiconductor wafer;
    rotating said wafer carrier while said semiconductor wafer is held on said wafer carrier; and
    polishing a surface of said semiconductor wafer with said polishing cloth by moving said polishing platen horizontally across the surface of the semiconductor wafer while rotating said polishing platen.
        wherein said polishing platen is moved horizontally across the surface of the semiconductor wafer so that a displacement velocity of said polishing platen is slower at a central portion of said semiconductor wafer than at an outer portion.

6. A chemical mechanical polishing method according to claim 5, wherein an etching rate during polishing is controlled by adjusting a displacement velocity of said polishing platen, or a rotation rate of said polishing platen, or a rotation rate of said semiconductor wafer.

7. A chemical mechanical polishing apparatus comprising:
    a wafer carrier configured to hold a semiconductor wafer;
    a polishing platen positioned facing a surface of said wafer carrier on which the wafer is held;
    polishing platen rotation means for rotating said polishing platen;
    polishing platen horizontal displacement means for moving said polishing platen horizontally across a surface of said semiconductor wafer;
    a circular polishing cloth mounted on said polishing platen and having a diameter that is smaller than a diameter of said semiconductor wafer, for polishing said semiconductor wafer; and
    a polishing slurry supply device configured to supply a polishing slurry onto said semiconductor wafer,
        wherein said polishing slurry supply device is positioned outside of a horizontal displacement path of said polishing platen.

* * * * *